United States Patent
Willer et al.

(10) Patent No.: US 6,686,242 B2
(45) Date of Patent: Feb. 3, 2004

(54) METHOD FOR PRODUCING METALLIC BIT LINES FOR MEMORY CELL ARRAYS, METHOD FOR PRODUCING MEMORY CELL ARRAYS AND MEMORY CELL ARRAY

(75) Inventors: Josef Willer, Riemerling (DE); Ronald Kakoschke, München (DE)

(73) Assignee: Infineon Technologies AG, Munich (DE)

( * ) Notice: Subject to any disclaimer, the term of this patent is extended or adjusted under 35 U.S.C. 154(b) by 228 days.

(21) Appl. No.: 09/917,867

(22) Filed: Jul. 26, 2001

(65) Prior Publication Data

US 2002/0132430 A1 Sep. 19, 2002

(30) Foreign Application Priority Data

Mar. 2, 2001 (DE) .......................... 101 10 150

(51) Int. Cl.$^7$ ............................ H01L 21/336
(52) U.S. Cl. ....................... 438/257; 257/324
(58) Field of Search .................. 438/257; 257/324

(56) References Cited

U.S. PATENT DOCUMENTS

| | | | |
|---|---|---|---|
| 5,233,210 A | | 8/1993 | Kodama |
| 5,270,240 A | * | 12/1993 | Lee .................. 438/257 |
| 5,292,681 A | * | 3/1994 | Lee et al. .............. 438/201 |
| 5,401,992 A | | 3/1995 | Ono |
| 5,439,835 A | * | 8/1995 | Gonzalez ............ 438/241 |
| 5,467,308 A | | 11/1995 | Chang et al. |
| 5,679,591 A | | 10/1997 | Lin et al. |
| 5,768,192 A | | 6/1998 | Eitan |
| 5,838,041 A | * | 11/1998 | Sakagami et al. ...... 257/324 |
| 6,117,730 A | | 9/2000 | Komori et al. |
| 6,300,194 B1 | * | 10/2001 | Locati et al. ............ 438/257 |

FOREIGN PATENT DOCUMENTS

| | | |
|---|---|---|
| EP | 0 364 769 A2 | 4/1990 |
| EP | 0 368 097 A2 | 5/1990 |
| EP | 0 573 168 A1 | 12/1993 |
| EP | 0 986 100 A1 | 3/2000 |
| EP | 1 073 121 A2 | 1/2001 |

OTHER PUBLICATIONS

Eitan, Boaz et al.: "NROM: A Novel Localized Trapping, 2–Bit Nonvolatile Memory Cell", IEEE Electron Letters, vol. 21, No. 11, Nov. 2000, pp. 543–545.

* cited by examiner

Primary Examiner—Amir Zarabian
Assistant Examiner—Jeff Vockrodt
(74) Attorney, Agent, or Firm—Laurence A. Greenberg; Werner H. Stemer; Ralph E. Locher

(57) ABSTRACT

A method for producing bit lines for a memory cell array comprises as a first step the step of providing a layer structure which comprises a substrate having transistor wells implanted in a surface thereof, a sequence of storage medium layers provided on the surface of said substrate, and a gate region layer provided on said sequence of storage medium layers. Bit line recesses, which extend down to the sequence of storage medium layers, are produced in said gate region layer. Subsequently, insulating spacer layers are produced on lateral surfaces of said bit line recesses, whereupon a source/drain implantation is executed in the area of said bit line recesses, after a complete or partial removal of the sequence of storage medium layers. Following this, the substrate is exposed completely in the area of the bit line recesses, if this has not yet been done prior to the implantation. Subsequently, metallizations for producing metallic bit lines are produced on the exposed substrate, said metallizations being insulated from the gate region layer by the insulating spacer layers.

13 Claims, 7 Drawing Sheets

METHOD FOR PRODUCING METALLIC BIT LINES FOR MEMORY CELL ARRAYS, METHOD FOR PRODUCING MEMORY CELL ARRAYS AND MEMORY CELL ARRAY

BACKGROUND OF THE INVENTION

1. Field of the Invention

The present invention relates to methods for producing metallic bit lines for memory cell arrays, methods for producing memory cell arrays including such metallic bit lines, and memory cell arrays produced by means of these methods. In particular, the present invention relates to methods and devices which are suitable to be used for planar EEPROMS for so-called "stand-alone" applications and for so-called "embedded" applications. The present invention is especially suitable for building up memory cells which are constructed according to the SONOS principle (SONOS= silicon-oxide-nitride-oxide-silicon). Such memory cells can advantageously be used e.g. in a virtual-ground-NOR architecture.

One of the most important development aims in the field of memory cells is the realization of increasingly smaller memory cells, i.e. the use of increasingly smaller chip areas per bit stored. Up to now, it has been considered advantageous to realize compact cells by means of buried, i.e. diffused bit lines. However, bit lines implemented as diffusion areas become increasingly high ohmic as their structural size decreases, since the diffusion depth must be scaled as well, so as to counteract the risk of a punch through between neighbouring bit lines. The problem arising in this connection is that high-ohmic bit lines permit only comparatively small cell blocks so that the utilization degree decreases and the advantage of the smaller memory cells, for which a higher process expenditure must be tolerated, diminishes.

2. Description of the Prior Art

One example of known memory cells with buried bit lines and a virtual-ground-NOR architecture is described in the article: "NROM: A Novel Localized Trapping, 2-Bit Non-volatile Memory Cell", Boaz Eitan et al, IEEE Electron Device Letters, Vol. 21, No. 11, November 2000, pp. 543–545.

SUMMARY OF THE INVENTION

It is the object of the present invention to provide methods and devices which permit the realization of very compact memory cells also in larger cell blocks.

According to a first aspect of the present invention, this object is achieved by a method for producing bit lines for a memory cell array, said method comprising the following steps:

providing a layer structure which comprises a substrate having transistor wells implanted in a surface thereof, a sequence of storage medium layers provided on the surface of said substrate, and a gate region layer provided on said sequence of storage medium layers;

producing bit line recesses in said gate region layer, said bit line recesses extending down to the storage medium layer;

producing insulating spacer layers on lateral surfaces of said bit line recesses;

removing the sequence of storage medium layers fully or partly in the area of the bit line recesses;

executing a source/drain implantation in the area of said bit line recesses;

removing the sequence of storage medium layers completely in the area of the bit line recesses, if said sequence of storage medium layers was not completely removed previously; and producing metallizations on the areas subjected to the source/drain implantation, so as to produce the metallic bit lines, said metallizations being insulated from the gate region layer by the insulating spacer layers.

According to a second aspect of the present invention, this object is achieved by a method for producing a memory cell array, said method comprising the following steps:

providing a layer structure which comprises a substrate having transistor wells implanted in a surface thereof, a sequence of storage medium layers provided on the surface of said substrate, and a gate region layer provided on said sequence of storage medium layers;

producing bit line recesses in said gate region layer, said bit line recesses extending down to the storage medium layer;

producing insulating spacer layers on lateral surfaces of said bit line recesses;

removing the sequence of storage medium layers fully or partly in the area of the bit line recesses;

executing a source/drain implantation in the area of said bit line recesses;

removing the sequence of storage medium layers completely in the area of the bit line recesses, if said sequence of storage medium layers was not completely removed previously;

producing metallizations on the areas subjected to the source/drain implantation, so as to produce the metallic bit lines, said metallizations being insulated from the gate region layer by the insulating spacer layers;

filling the bit line recesses remaining after the production of the metallic bit lines with an insulating material; and producing word lines which extend substantially at right angles to said bit lines and which are each connected to a plurality of gate regions, said gate regions being produced when the word lines are being produced, by means of suitable patterning of the remaining parts of the gate region layer.

In accordance with preferred embodiments of the present invention, the metallic bit lines are produced by executing a Ti- or Co-silicide process on the exposed substrate areas which were previously subjected to a source/drain implantation, which can also be referred to as bit-line implantation. During the silicide process for producing the metallizations on the source/drain implantations, the future gate structures are preferably provided with a hard mask consisting preferably of nitride. The areas subjected to the source/drain implantation serve as source/drain regions of the storage transistors, the silicidation of these areas serving as a metallic bit line. The gate regions or gate structures, which are initially implemented as strips extending along the bit line in the case of the method according to the present invention, are etched, preferably by a dry-etching process, during the production of the word lines in a self-aligning manner relative to these word lines.

Making use of the method according to the present invention, peripheral transistors can additionally be produced in areas outside of the memory cell array, parallel to the production of the memory cell array. The methods according to the present invention can be used for realizing peripheral transistors with so-called single-workfunction gates, in which all the polycrystalline gate regions are of the same doping type, as well as peripheral transistors with so-called dual-workfunction gates, in which the doping type of the polycrystalline gate regions is adapted to the channel type, i.e. the doping type of the source/drain regions.

According to a third aspect of the present invention, the above object is achieved by a memory cell array comprising:
- a plurality of memory cells arranged in a two-dimensional array and realized by field-effect transistors formed in a substrate;
- word lines which are arranged in a first direction with respect to the memory cell array and which are connected to gate regions of the memory cells in an electrically conductive manner; and
- bit lines extending between the memory cells in a second direction substantially at right angles to said first direction,
- the bit lines being defined by metallic structures which are produced directly on the source/drain regions of the memory cells, and insulating means being provided between the metallic structures of the bit lines and the gate regions of the memory cells.

It follows that the present invention provides methods for producing memory cell arrays with metallic bit lines which are self-aligned relative to gate structures, and memory cell arrays including such bit lines. Furthermore, gate structures which are self-aligned relative to metallic word lines are produced according to the present invention. The present invention additionally permits an advantageous incorporation of a parallel production of the memory cell array and of the peripheral circuit structures in the manufacturing process in question.

Due to the production of metallic i.e. metallized bit lines and, in addition, due to the production of metallic i.e. metallized word lines, the present invention permits the formation of large cell blocks having a minimum periphery and, consequently, a high cell efficiency. Due to the use of metallic bit lines, the bit lines can be so narrow that a cell area of $4F^2$ can be realized, F indicating the possible line width, when the technique used is a lithographic technique; today's lithographic technologies achieve line widths of 140 nm. In the production method and the structural design according to the present invention, the bit-line plane and the word-line plane can be used as a metallic wiring plane. Furthermore, the method according to the present invention can be combined with the single-workfunction technology as well as with the dual-workfunction technology.

BRIEF DESCRIPTION OF THE DRAWINGS

In the following preferred embodiments of the present application will be explained in detail making reference to the drawings enclosed, in which.

DESCRIPTION OF PREFERRED EMBODIMENTS OF THE INVENTION

Figure 1:
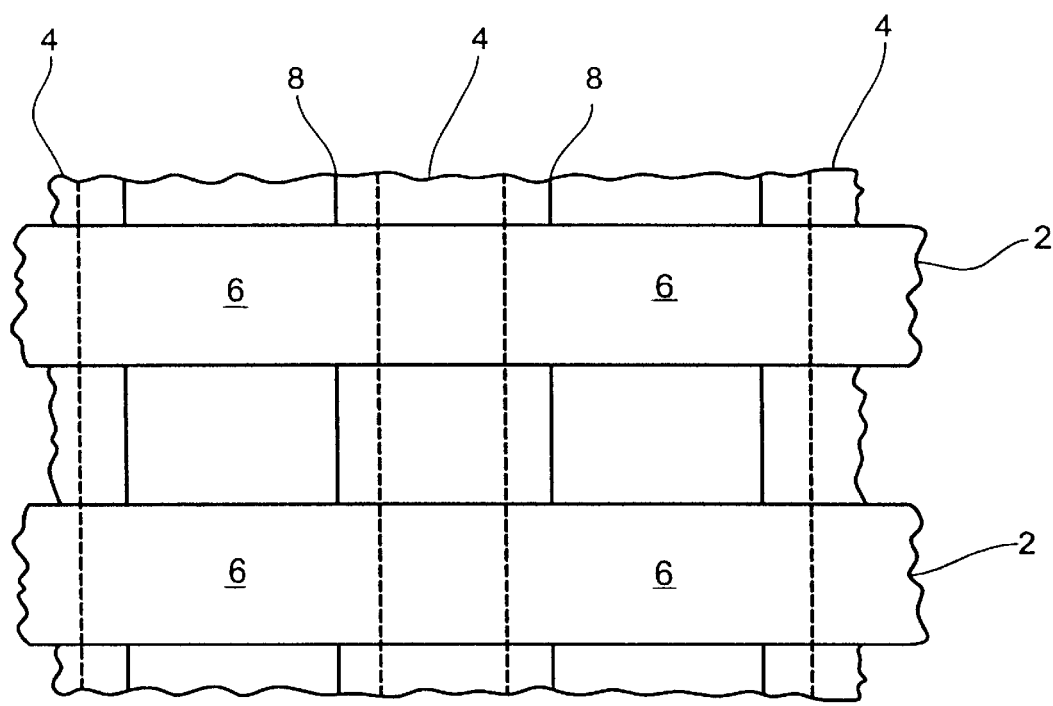
FIG. 1 shows a top view of a detail of a memory cell array.

Before preferred embodiments for producing bit lines for a memory cell array and for producing a memory cell array will be explained in detail in the following making reference to FIG. 2 to 11, the general arrangement of the resultant bit lines and word lines of a virtual-ground-NOR architecture will first be described making reference to FIG. 1. FIG. 1 schematically shows sections of two word lines 2 which extend at right angles to bit lines 4 so that the word lines 2 define together with the bit lines 4 a lattice structure. In FIG. 1 the broken lines represent the metallic bit lines 4 according to the present invention, whereas the solid lines 8 represent the source/drain implantation region on which the metallic bit lines are formed.

In such a virtual-ground architecture respective memory cells 6 are arranged below the word lines 2 between the bit lines 4. Below the word lines gate regions are provided in this area, whereas the diffusion regions i.e. source/drain implantations arranged below the bit lines define the source drain regions of a respective cell.

According to the present invention, the metallic bit lines and also the word lines are preferably formed making use of a silicidation. Methods known under the name of silicidation are methods in the case of which a suitable metal, e.g. cobalt, titanium, alloys thereof, or nickel or tungsten are applied to silicon in a first step, whereupon a temperature treatment is carried out. Due to the temperature treatment, a chemical reaction takes place between the metal applied and the silicon, whereby a silicide layer is produced on the silicon. This production of a metallic silicide layer on silicon is referred to as silicidation.

In a first embodiment of the present invention used for the production of a memory cell array and for the parallel production of peripheral transistors, which will be described making reference to FIG. 2 to 7, a so-called polycide method is additionally used for producing the word lines of the memory cell array and for producing the gate structures of the peripheral transistors.

Methods known under the name of polycide methods are methods in the case of which a full-area polycrystalline silicon layer is first applied i.e. deposited, whereupon the polycrystalline silicon layer has deposited thereon a full-area WSi layer as an alloy. Subsequently, a hard mask consisting preferably of nitride is normally applied to the WSi layer. The hard mask is then patterned making use of phototechnical methods, whereupon the Wsi layer and the polycrystalline silicon located below this layer are etched so as to produce the desired structures.

Alternatively to the above-described polycide method, a method is known in the case of which a polycrystalline silicon layer has first applied thereto a tungsten nitride layer and, subsequently, a tungsten layer. In this case, the tungsten nitride layer acts as a diffusion barrier so that no tungsten silicide, i.e. no alloy, will be formed, but a correspondingly low-ohmic pure metal structure.

In a second embodiment of a method for producing a memory cell array according to the present invention, which will be described in the following making reference to FIG. 8 to 11, a so-called salicide method is used for producing the word lines and the gate structures of the peripheral transistors. Methods known under the name of salicide methods are methods in the case of which a structure comprising silicon regions and non-silicon regions, e.g. oxide regions or nitride regions, has first deposited thereon a suitable metal, e.g. cobalt, titanium or alloys of these metals, e.g. cobalt/titanium nitride alloys, over the full area thereof. When a temperature treatment is carried out subsequently, a chemical reaction takes place at the locations at which the full-area metal is in contact with the silicon so that a silicide layer will be produced there. In other areas in which the metal borders on the oxide or on the nitride, a chemical reaction will not take place. Subsequently, the metal which has not undergone a chemical reaction can be removed by a wet-chemical process so that a structure will remain in which all the silicon regions are coated with a silicide layer.

In the following, the first embodiment of a method for producing a memory cell array according to the present invention, which includes the method for producing a bit line for a memory cell array according to the present invention, will be described.

The methods according to the present invention are based on a pretreated substrate structure which will first be described briefly. For this purpose, insulated regions, which are intended to comprise e.g. a specific number of memory cells and specific peripheral circuit structures later on, are first defined in a silicon substrate. These regions are preferably produced making use the so-called STI technique (STI=shallow trench isolation). According to this technique, a pad-oxide is first grown and a pad-nitride is deposited subsequently. Following this, a phototechnique is carried out for defining the trenches which are then etched. The etched trenches are then filled with an oxide, whereupon suitable planarizing measures, e.g. chemical-mechanical polishing (CMP; CMP=chemical-mechanical polishing), are carried out. Finally, the residual nitride is removed by means of etching.

When the isolated regions have been produced in the manner described hereinbefore, the p- and n-wells for the future CMOS region in the periphery of the memory cell array and the wells for the memory cells are produced by a masked boron and phosphor implantation and by subsequent annealing. Following this, the scattered oxide is removed. On the resultant structure an ONO triple layer (ONO=oxide-nitride-oxide) is grown, which serves as a storage medium. This step is followed by a masked removal of this layer in the future CMOS region. In this region a gate oxide is grown or rather several gate oxides are grown in repetitive steps.

Figure 2:
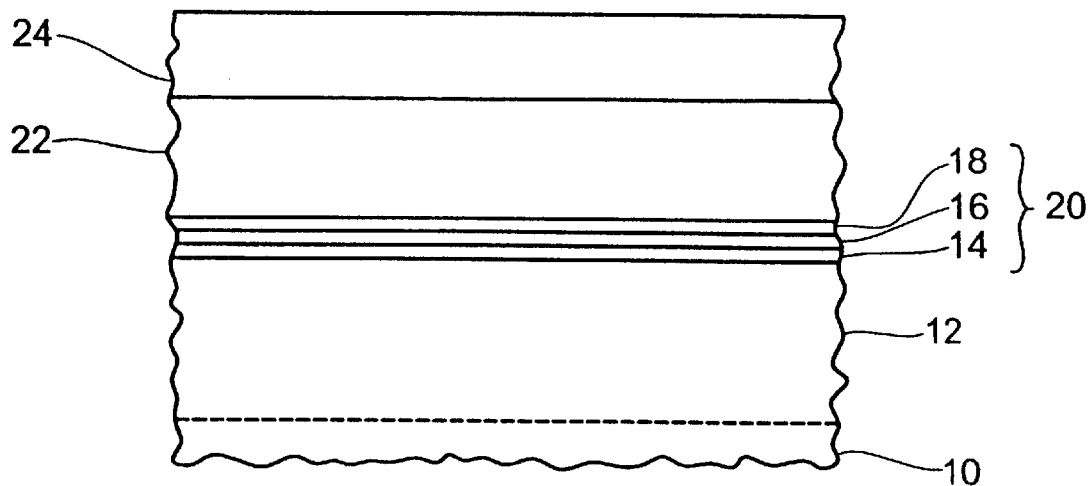
FIG. 2 shows a schematic cross-sectional view of a sequence of layers in an initial stage of the method according to the present invention.

The structure produced making use of the above-described pretreatement serves as a basis for the methods according to the present invention. According to the present invention, this structure has first deposited thereon a polysilicon layer which serves as a gate region layer and which has, in turn, deposited thereon a nitride layer. A schematic cross-sectional view of a section of the resultant layer sequence in the memory cell region is shown in FIG. 2. As has been described hereinbefore, a transistor well 12 is formed in a silicon substrate 10. The transistor well 12 has formed thereon the described ONO triple layer 20 comprising a lower oxide layer 14, a nitride layer 16 and an upper oxide layer 18. Outside of the memory cell region this ONO triple layer is replaced by a gate oxide. The ONO triple layer 20 has formed thereon a polycrystalline layer 22 having a thickness of e.g. 100 nm. This polycrystalline layer 22 has formed thereon a nitride layer 24, which has a thickness of e.g. 50 nm, as a hard-mask layer.

Figure 3:
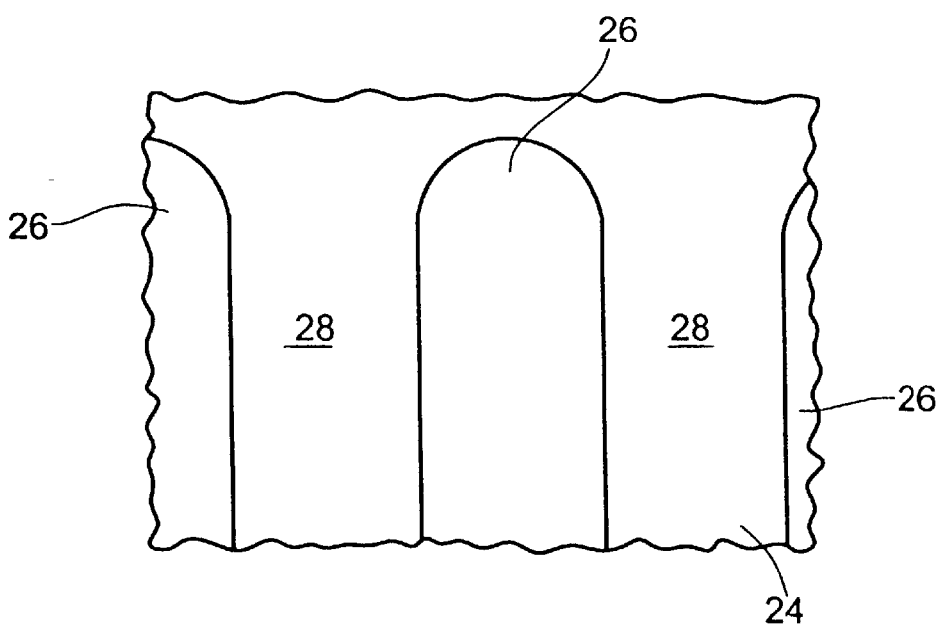
FIG. 3 shows a schematic top view of a section of the substrate with bit line recess regions.
Figure 4A:
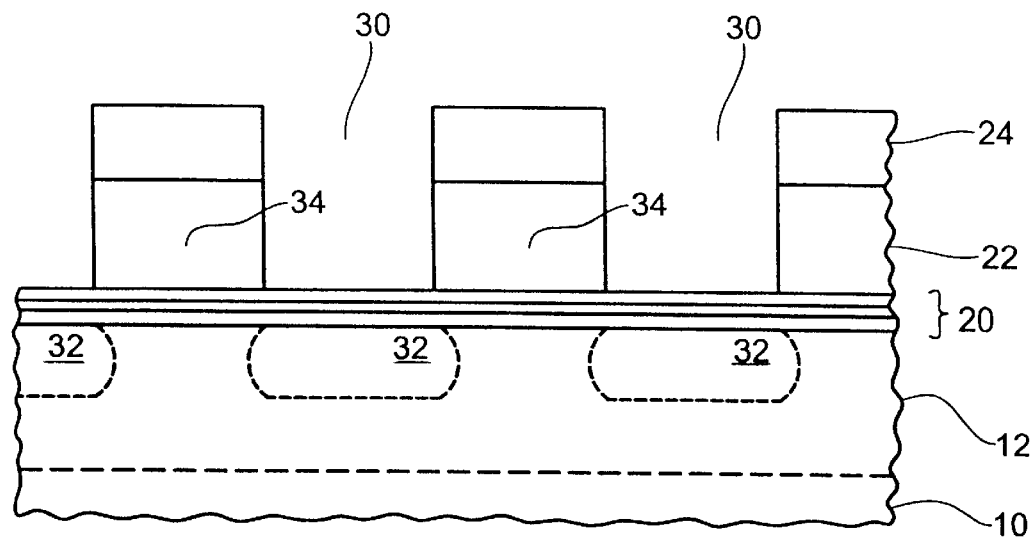
FIG. 4a to 4c show schematic cross-sectional views for illustrating a first embodiment of the method for producing a memory cell array according to the present invention.

In a next step, a phototechnique is executed so as to produce elongate recesses 26 in the nitride layer 24; as can be seen in FIG. 3, these recesses extend along the bit lines which are to be produced later on. By means of these recesses 26, strips 28 are additionally defined along the future bit lines, these strips 28 contributing to the definition of the future gate structures. When the nitride layer 24 has been etched for producing the recesses 26, the resist used in the phototechnique is stripped, whereupon the polycrystalline layer 23 is etched making use of the nitride layer 24 as a mask. The ONO triple layer 20 is used as an etch stop in this process. The resultant structure in which bit line recesses 30 are formed in the nitride layer 24 and in the polycrystalline layer 22 is shown in FIG. 4a. By producing the bit line recesses 30 in the polycrystalline layer 22, stripshaped gate regions 34, which extend along the future bit lines, are produced in this polycrystalline layer 22.

Preferred embodiments of the present invention are so conceived that, subsequent to the production of the bit line recesses 30, an implantation of a doping type corresponding to the doping type of the transistor well 12 is carried out in the recessed areas through the ONO layer sequence 20 so as to produce doped areas 32. This implantation is optional. In the case of n-channel storage transistors, this implantation is preferably a boron implantation with a concentration of e.g. $1 \times 10^{14}$ cm$^{-3}$. The implantations 32 serve, on the one hand, to produce a hard p-n junction with the bit line implantations and the source-drain implantations produced later on. On the other hand, the production of the doped regions 32 results in an underscattering under the gate edge and, consequently, in a penetration below the channel so that an improved punch resistance can be achieved. Such an implantation 32 will be advantageous especially in cases in which 2-bit memory cells of the type described e.g. in the above-described publication by Boaz Eitan are to be realized by the memory cells.

Figure 4B:
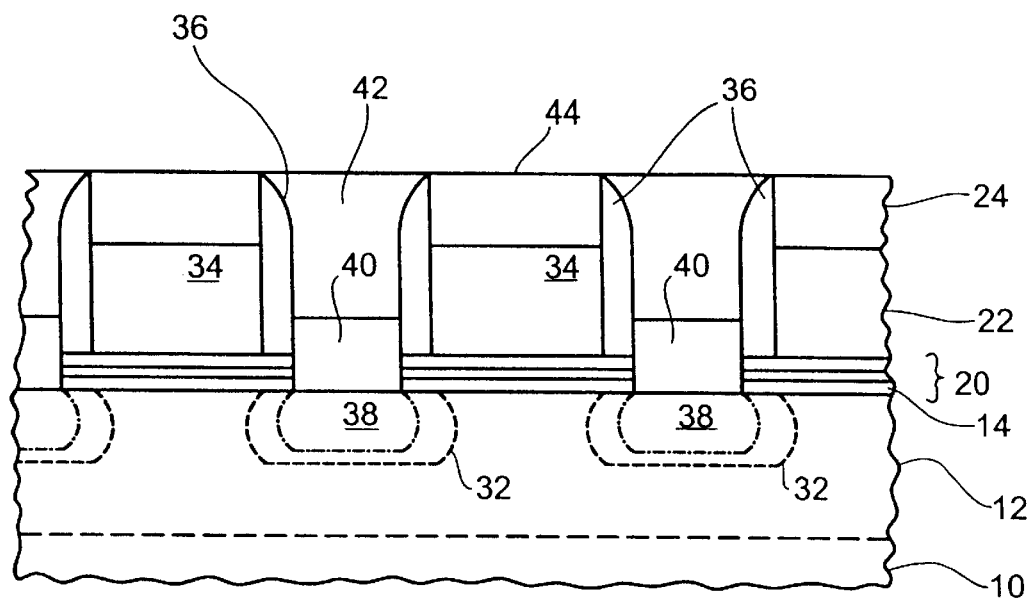
Figure 4:
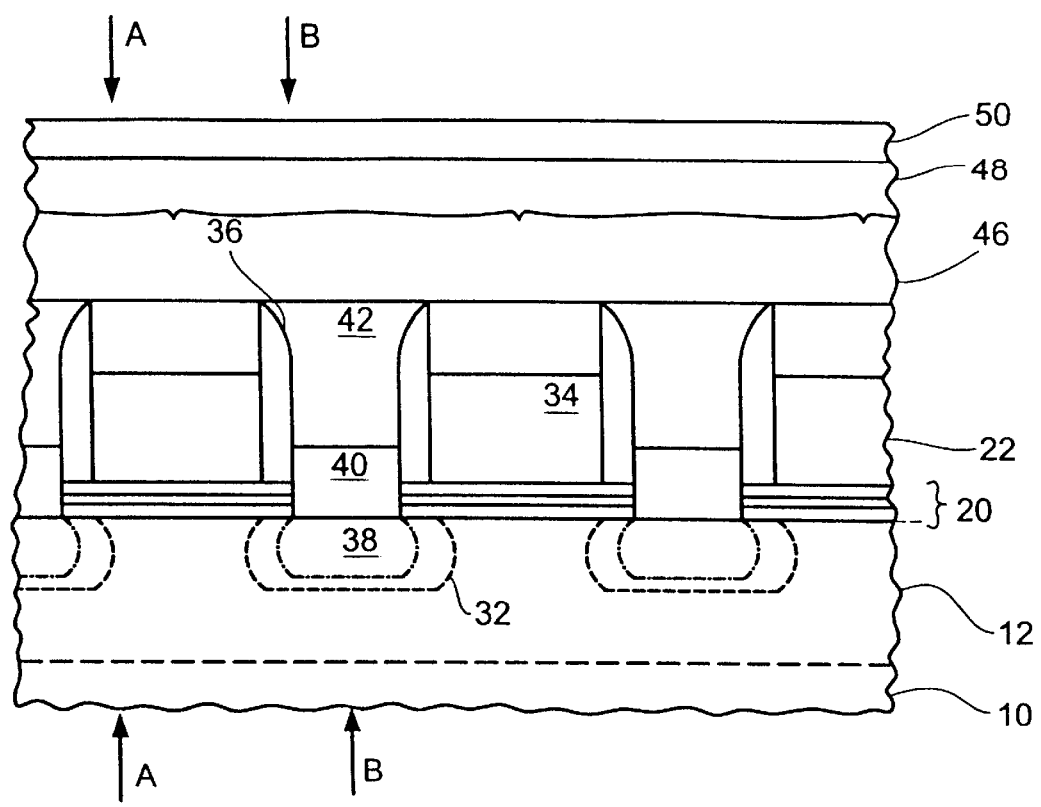

Making use of known methods, insulating spacer layers 36, FIG. 4b, are produced in a subsequent step on the lateral surfaces of the stripshaped polycrystalline regions 34 and on the parts of the nitride layer 24 arranged thereon. For this purpose, an oxide layer is preferably first produced, e.g. from TEOS (TEOS=tetraethylorthosilicate), by conformal deposition. By means of this kind of deposition, a full-area oxide layer is obtained, which, in ideal circumstances, has the same thickness on horizontal and vertical surfaces of a structure. This oxide layer is then removed from the horizontal surfaces by means of subsequent anisotropic dry etching so that the lateral oxide spacer layers 36, which can be seen in FIG. 4b, remain.

After the production of the oxide spacer layers, which may have a thickness of e.g. 40 nm, reactive ion etching is preferably used so as to open those parts of the ONO triple layer structure which are still exposed after the production of the spacer layers. Through the openings in the ONO triple layer structure 20 source/drain implantations are formed; in the case of n-channel storage transistors these source/drain implantations are preferably formed by implantation with arsenic with a doping concentration of $3\times10^{15}$ cm$^{-3}$. The source/drain implantations 38 extend along the future bit lines and can therefore also be referred to as bit line implantations.

It should here be pointed out that it is not necessary to remove the whole ONO triple layer structure 20 prior to carrying out the implantation for producing the regions 38, but that the implantation can be carried out e.g. through the lower oxide layer 14, which serves then as a scattered oxide. If the implantation is carried out through the lower oxide layer 14, this oxide layer 14 will have to be removed subsequently so as to expose the upper surface of the substrate 12 in the area in which the source/drain implantation was carried out and in which the metallic bit lines are to be formed.

Following this, a metal for a self-aligned silicidation is deposited, preferably Ti, Co or alloys thereof. This deposition step is followed by tempering, which is necessary for silicidation, and by the removal of the non-silicided metal. The metallizations 40 on the source/drain implantations 38, which are shown in FIG. 4b and which represent the metallic bit lines 40, are produced in this way. Subsequently, the remaining gaps are filled with an insulating material 42, preferably by means of oxide deposition (TEOS). The resultant surface is then subjected to a planarization, e.g. by making use of a reactive ion etching process or, preferably, of a CMP technique; in this case, the very hard nitride layer can be used as a mechanical grinding stop. A cross-section of the resultant structure is schematically shown in FIG. 4b.

For producing the word lines, which extend at right angles to the bit lines 40 produced, the nitride, which is still located on the stripshaped gate region 34 and which is designated by reference numeral 44 in FIG. 4b, is first removed by a wet-chemical process for which hot phosphoric acid is preferably used. As can be seen in FIG. 4c, a layer structure comprising a second polycrystalline layer 46, a metallic layer 48 and a hard mask 50, preferably nitride, is produced on the resultant structure. The second polycrystalline layer 46 is produced by deposition, whereas the metallic layer 48 is produced by deposition of Wsi. Alternatively, a layer sequence comprising polycrystalline silicon, tungsten nitride and tungsten can here been produced in the manner explained hereinbefore. The nitride layer 50 is then produced as a hard mask by deposition on the second polycrystalline layer 46.

Figure 5:
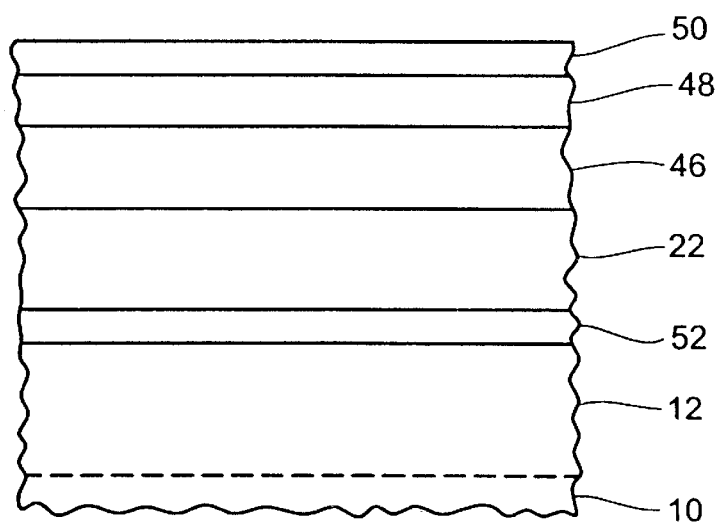
FIG. 5 shows a schematic cross-sectional view of an intermediate stage in the production of a peripheral transistor according to the first embodiment.

The layer structure obtained in the peripheral region by the above-described method steps is shown in FIG. 5; the ONO triple layer structure 20 is replaced by a gate oxide layer 52 in the peripheral region, as has been described hereinbefore.

Taking as a basis the layer structures shown in FIG. 4c and 5, a phototechnique is then carried out so as to pattern in the hard mask 50 the word lines within the cell array and the gate regions in the periphery. Subsequently, the word-line structure comprising the first polycrystalline layer 22, the second polycrystalline layer 46 and the metal layer 48 is etched with high selectivity with regard to oxide. Following this, an anti-punch implantation is optionally executed between the word lines, making e.g. use of a suitable phototechnique.

Figures 6A, 6B:
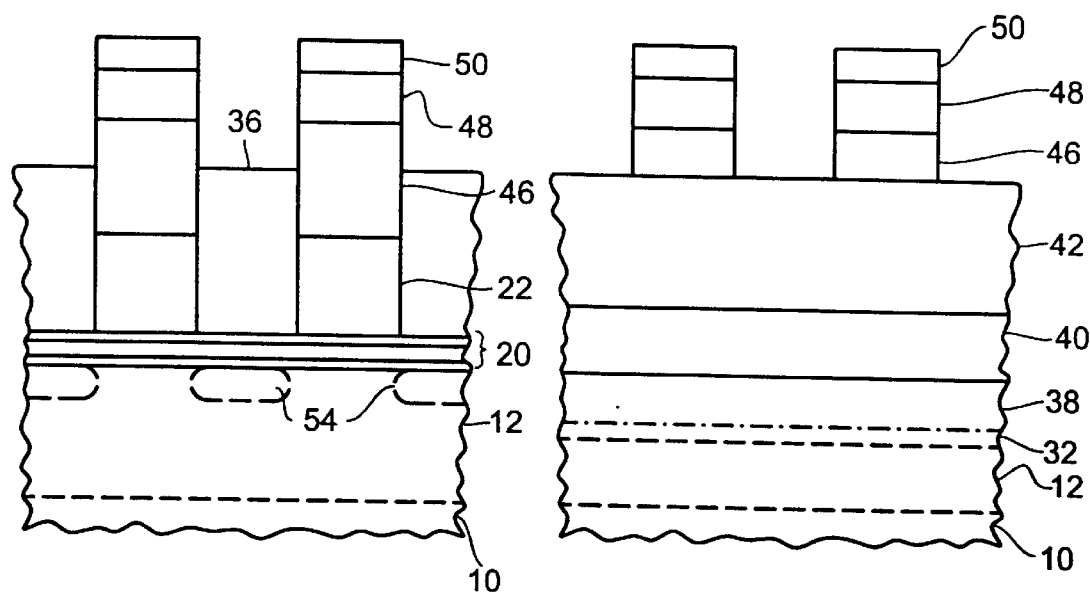
FIG. 6a and 6b show schematic cross-sectional views of an advanced production stage for illustrating the word- and bit-line pattern according to the first embodiment.

The sectional view of the resultant structure, which is defined by arrows A in FIG. 4c, is shown in FIG. 6a, whereas a sectional view defined by arrows B is shown in FIG. 6b. In FIG. 6a, the above-mentioned anti-punch implantations are designated by reference numeral 54.

Figure 7:
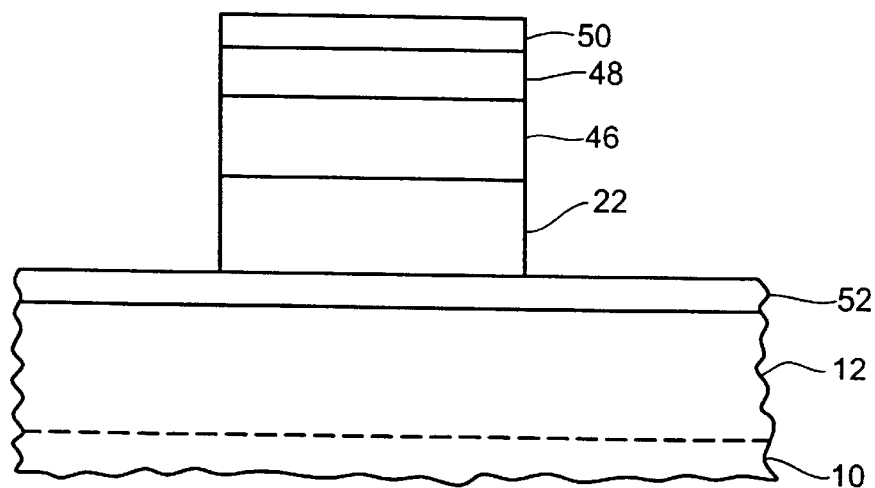
FIG. 7 shows a schematic cross-sectional view of an advanced production stage with respect to a peripheral transistor according to the first embodiment.

Parallel to the above-described steps of patterning the word lines, the gate structures of the peripheral transistors are patterned in the peripheral areas; FIG. 7 shows a schematic cross-sectional view which shows a gate stack of such a transistor gate comprising a first polycrystalline layer 22, a second polycrystalline layer 46, a metallic layer 48 and the residual hard-mask layer 50.

After the above-described patterning of the word lines in the memory cell area and of the gate structures in the peripheral area, additional steps for further insulating the word lines and for building up the peripheral transistors are carried out in the manner known. Such additional steps comprise e.g. a gate reoxidation of the peripheral transistors, the provision of nitride- and/or oxide-spacer layers on lateral surfaces of the peripheral transistors, which preferably also leads to a filling of the gaps between the patterned word-line structures, LDD implantations (LDD=lightly doped drain) and HDD implantations (HDD=heavily doped drain) as well as nitride/BPSG depositions and planarizations, making e.g. use of CMP techniques. Finally, steps which are known in the prior art are executed for producing and filling contact holes and for effecting metallization and passivation.

In the above-described embodiment, the polycrystalline layers 22 and 46 are deposited as in-situ doped polylayers; in the case of the n-channel transistors of the preferred embodiments, n$^+$-doped polysilicon layers are deposited. In this first embodiment, the word lines are metallized making use of the above-described polycide technique. This embodiment is suitable for use in the single workfunction gate technology, which is advantageously employed e.g. for realizing DRAMs and the like.

An alternative embodiment which is suitable for use for the dual workfunction gate technology for high-performance CMOS applications will now be described.

With regard to the production of the metallic i.e. metallized bit lines, this second embodiment does not differ from the first embodiment described hereinbefore, but in the second embodiment the process used for producing the word lines is a salicide process instead of the polycide process which has been described with regard to the first embodiment. For this purpose, a structure of the type shown in FIG. 4b, in which the nitride regions 44 have additionally been removed, is taken as a basis and a second polycrystalline layer is applied; this second polycrystalline layer has directly applied thereto an oxide hard mask. It should here be pointed out that in the second embodiment both the first polycrystalline layer and the second polycrystalline layer are initially applied as undoped layers. A doping of the first polycrystalline layer can be carried out together with the doping of the source/drain regions either after the removal of the nitride layer 44 or through the nitride layer, provided that it is thin enough.

Figures 8A, 8B:
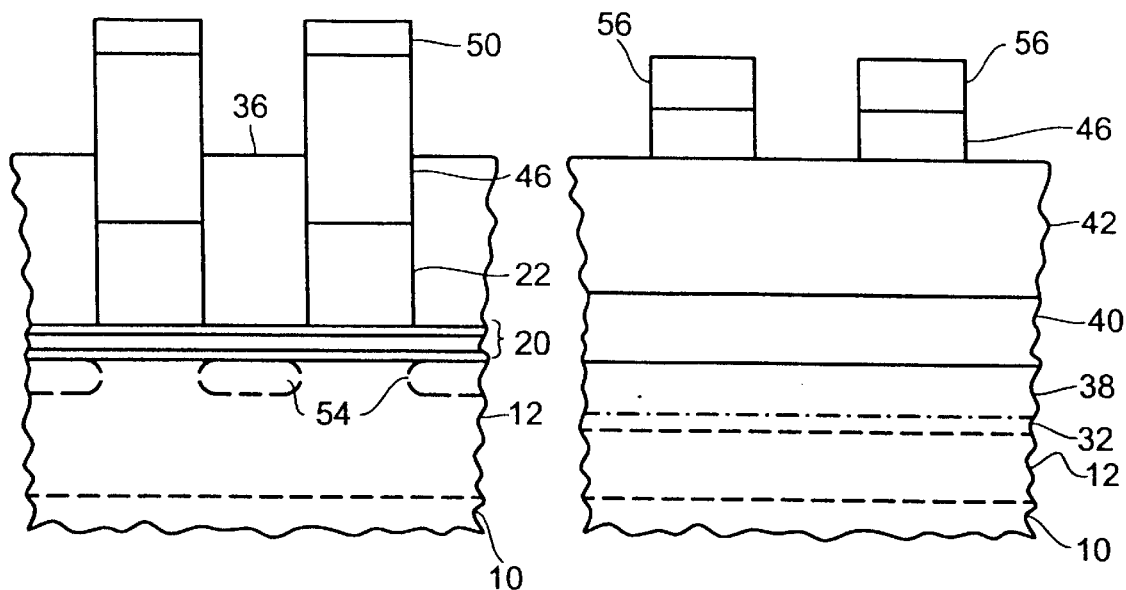
FIG. 8a and 8b show schematic cross-sectional views according to FIG. 6a and 6b for a second embodiment of a method for producing a memory cell array according to the present invention.

After the above-described application of the second polycrystalline layer and of the oxide hard mask, the word-line structures in the memory cell area and the gate structures in the peripheral area are produced. The resultant structure in the memory cell area is shown in FIG. 8a and 8b in schematic cross-sectional views corresponding analogously to the cross-sectional views shown in FIG. 6a and 6b; identical reference numerals have been used for corresponding features in these figures. Furthermore, the remaining areas 56 of the oxide hard mask are shown in FIG. 8a and 8b.

Figure 9:
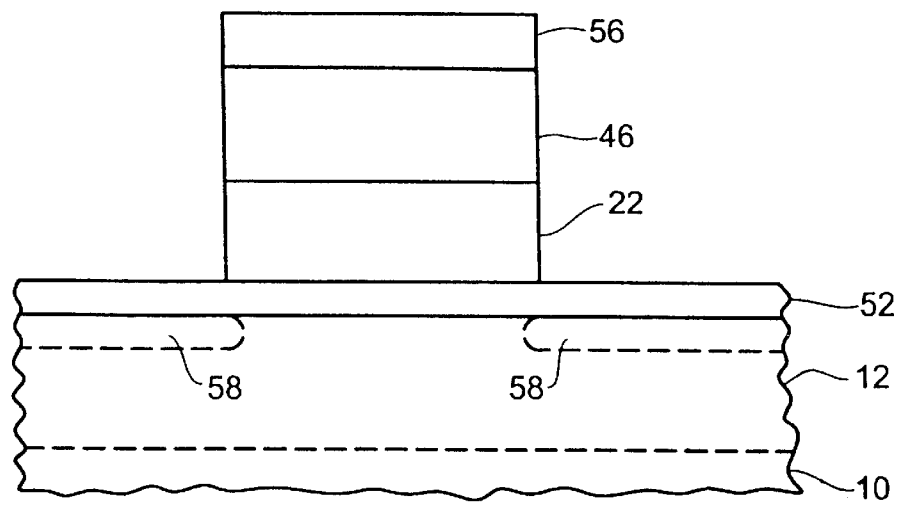
FIG. 9 shows a schematic cross-sectional view according to FIG. 7 for the second embodiment.
Figure 10:
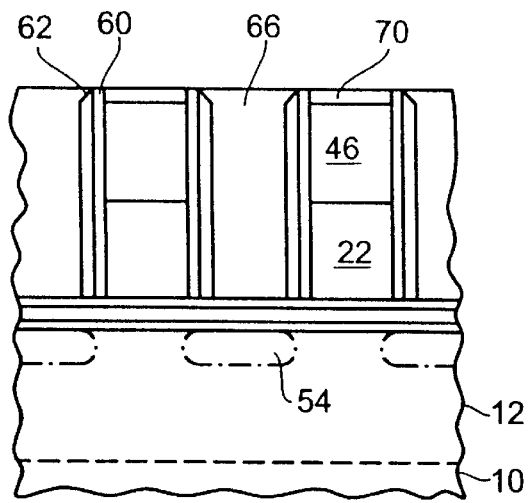
FIG. 10a and 10b show schematic cross-sectional views for illustrating the production of metallic word lines in the case of the second embodiment.
Figure 10:
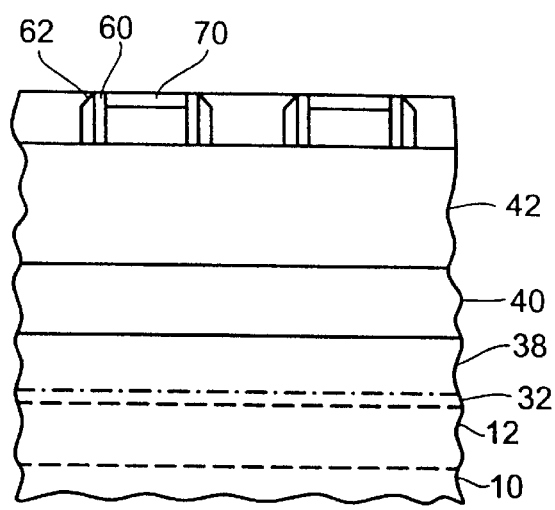

In FIG. 9 a schematic cross-sectional view of the resultant peripheral transistor structure is shown; in this structure LDD implantations 58 for the source and gate regions of the peripheral transistor have already been carried out.

Figure 11:
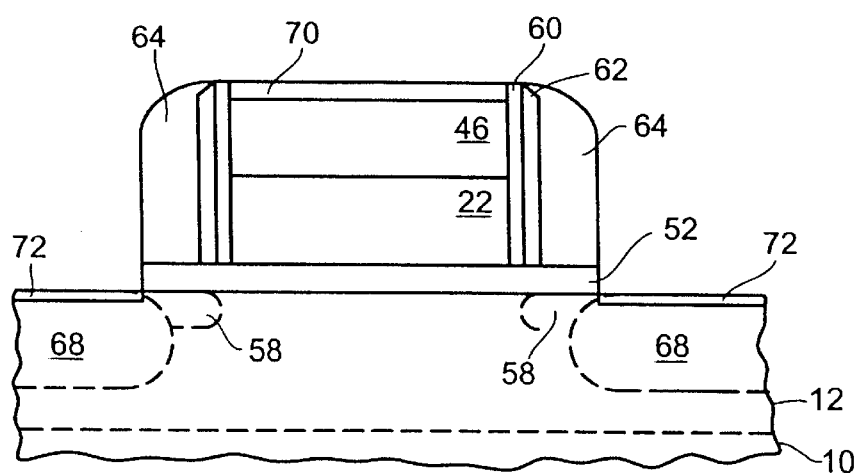
FIG. 11 shows a schematic cross-sectional view for illustrating a peripheral transistor produced according to the second embodiment.

Starting from the conditions shown in FIG. 8 and 9, a gate reoxidation, i.e. an overoxidation, is preferably carried out in a first step by means of which thin oxide layers 60 having a thickness of e.g. 6 nm are produced on the lateral surfaces of the word-line structures in the memory cell area and of the gate stack in the peripheral transistor area, as can be seen in FIG. 10a, 10b and 11.

Deviating from the embodiment shown, the reoxidation is preferably carried out before the LDD implantation so that an oxide produced in this way above the source/drain regions can be used as a scattered oxide for the LDD implantation. The oxide produced on the horizontal surfaces during the reoxidation process is removed by anisotropic etching processes. Following this, nitride spacer layers 62 are produced on the oxide layers 60 according to the preferred embodiment, whereupon additional oxide spacer layers 64 are applied to the lateral surfaces, cf. FIG. 11, which lead to a complete filling 66 of the word-line gaps in the memory cell area. It should here be pointed out that the implementation of the spacer layers and the material chosen for these layers depend on the dielectric strength which the peripheral transistors to be produced should have.

Also the outer oxide spacer layers 64 are preferably produced by a conformal oxide deposition (from TEOS), whereupon the oxide deposited on horizontal surfaces is removed by anisotropic etching. By means of this etching the remaining parts of the hard mask 56 are removed simultaneously so that the remaining parts of the second polycrystalline layer 46 are exposed.

In this condition, the implantation for producing the HDD regions 68 is now carried out, the doping of the second polycrystalline layer 46 being caused simultaneously.

Subsequently, a salicide process is executed so as to provide the word lines in the memory cell area as well as the gate stacks in the peripheral area with a metallization layer 70. For obtaining this metallization, a metal, Ti, Co or alloys thereof, is first applied over the full area, whereupon a tempering step is carried out so as to produce the silicide layers 70. During this silicidation, silicide layers 72 are additionally produced on the source/drain regions of the peripheral transistors. Subsequently, the parts of the applied metal layer which do not undergo any chemical reaction with silicon during the tempering step are removed, making preferably use of a wet-etching process. It should here be pointed out that, during the tempering step of the silicidation, the doping introduced in the second polycrystalline layer 46 during the implantation of the HDD regions 48 will additionally diffuse into the first polycrystalline layer 22.

Alternatively to the above-described second embodiment, the gate regions, i.e. the gate polysilicon, can be $p^+$-doped in the area of the memory cell array; this may have advantages with respect to the behaviour of the memory cells.

It follows that the present invention permits an advantageous incorporation of the production of metallic bit lines and metallic word lines for memory cell arrays in the manufacturing process in question, which permits large cell blocks to be built up with a minimum cell area of the individual cells. In particular, the present invention also permits memory cell structures and peripheral transistor structures to be produced in parallel to a far-reaching extent, and this leads to simple and economy-priced process sequences.

What is claimed is:

1. A method for producing a memory cell array, said method comprising the following steps:

a) providing a layer structure which comprises a silicon substrate having transistor wells implanted in a surface thereof, a sequence of storage medium layers provided on the surface of said substrate, and a gate region layer provided on said sequence of storage medium layers, said sequence of said storage medium layers being an oxide-nitride-oxide layer sequence, and said gate region layer being of a polycrystalline silicon;

b) producing bit line recesses in said gate region layer, said bit line recesses extending down to the storage medium layer;

c) producing insulating spacer layers on lateral surfaces of said bit line recesses;

d) removing the sequence of storage medium layers fully or partly in the area of the bit line recesses;

e) executing a source/drain implantation in the area of said bit line recesses;

f) removing the sequence of storage medium layers completely in the area of the bit line recesses, if said sequence of storage medium layers was not removed completely in step d);

g) producing metallizations on the areas subjected to the source/drain implantation, so as to produce metallic bit lines, said metallizations being insulated from the gate region layer by the insulating spacer layers;

h) filling the bit line recesses remaining after the production of the metallic bit lines with an insulating material; and i) producing word lines which extend substantially at right angles to said bit lines and which are each connected to a plurality of gate regions, said gate regions being produced when the word lines are being produced, by means of suitable patterning of the remaining parts of the gate region layer.

2. A method according to claim 1, wherein the metallic bit lines are produced by a silicide process.

3. A method according to claim 1, wherein, prior to step c), an implantation in the substrate is carried out in the area of the bit line recesses, said implantation being of a doping type which corresponds to that of the transistor wells.

4. A The method according to claim 1, wherein a hardmask layer is applied to the gate region layer prior to step b).

5. The method according to claim 1, wherein step
i) comprises the following sub-steps:
   i1) full-area application of a polycrystalline layer;
   i2) producing a silicide layer on said polycrystalline layer; and
   i3) patterning said suicide layer, said polycrystalline layer and said gate region layer so as to produce the gate regions and the word lines.

6. The method according to claim 5, comprising, after the step of producing word lines, a further step of producing anti-punch implantations in the substrate between the word lines.

7. The method according to claim 5, comprising the additional step of laterally applying insulating layers to lateral surfaces of the word lines and of the gate regions after step i).

8. A The method according to claim 5, comprising the additional step of completely filling gaps between the word lines and the gate regions with an insulating material after step i).

9. The method according to claim 5, wherein, parallel to the production of the memory cell array, peripheral transistors are produced outside of the area of said memory cell array.

10. The method according to claim 1, wherein step i) comprises the following sub-steps:
   i1) full-area application of a polycrystalline layer;
   i2) patterning the polycrystalline layer and the remaining parts of the gate region layer in accordance with the pattern of the word lines, whereby the gate regions are produced;
   i3) filling the recesses produced in step i2) in the polycrystalline layer and in the gate region layer with an insulating material; and
   i4) executing a silicide process for selectively producing a silicide layer on the polycrystalline layer patterned with the word-line pattern, so as to produce metallic word lines.

11. The method according to claim 10, wherein gate regions of peripheral transistors outside of the region of the memory cell array are additionally produced in step i2), said gate regions being provided with insulating layers on lateral surfaces in step i3), a silicide layer being additionally produced on the gate regions and on the source/drain regions of the peripheral transistors in step i4).

12. The method according to claim 11, comprising, after the step i2), a step of implanting the source/drain regions of the peripheral transistors in the substrate, the remaining parts of the polycrystalline layer being doped simultaneously in the implanting step.

13. A method for producing a memory cell array, said method comprising the following steps:
   a) providing a layer structure which comprises a substrate having transistor wells implanted in a surface thereof, a sequence of storage medium layers provided on the surface of said substrate, and a gate region layer provided on said sequence of storage medium layers;
   b) producing bit line recesses in said gate region layer, said bit line recesses extending down to the storage medium layer;
   c) producing insulating spacer layers on lateral surfaces of said bit line recesses;
   d) removing the sequence of storage medium layers fully or partly in the area of the bit line recesses;
   e) executing a source/drain implantation in the area of said bit line recesses;
   f) removing the sequence of storage medium layers completely in the area of the bit line recesses, if said sequence of storage medium layers was not removed completely in step d);
   g) producing metallizations on the areas subjected to the source/drain implantation, so as to produce metallic bit lines, said metallizationS being insulated from the gate region layer by the insulating spacer layers;
   h) filling the bit line recesses remaining after the production of the metallic bit lines with an insulating material; and
   i) producing word lines which extend substantially at right angles to said bit lines and which are each connected to a plurality of gate regions, said gate regions being produced when the word lines are being produced, by means of suitable patterning of the remaining parts of the gate region layer, wherein step i) comprises the following sub-steps:
   i1) full-area application of a polycrystalline layer;
   i2) patterning the polycrystalline layer and the remaining parts of the gate region layer in accordance with the pattern of the word lines, whereby the gate regions are produced;
   i3) filling the recesses produced in step i2) in the polycrystalline layer and in the gate region layer with an insulating material; and
   i4) executing a suicide process for selectively producing a silicide layer on the polycrystalline layer patterned with the word-line pattern, so as to produce metallic word lines.

* * * * *